United States Patent [19]

Means

[11] 4,055,776

[45] Oct. 25, 1977

[54] CCD DIFFERENTIAL CURRENT APPARATUS

[75] Inventor: Robert W. Means, Lausanne, Switzerland

[73] Assignee: The United States of America as represented by the Secretary of the Navy, Washington, D.C.

[21] Appl. No.: 735,652

[22] Filed: Oct. 26, 1976

[51] Int. Cl.² .............................................. H03K 5/20
[52] U.S. Cl. ........................................ 307/355; 307/208; 307/221 D; 307/282
[58] Field of Search ............... 307/282, 221 D, 221 C, 307/208, 235 F, 355

[56] References Cited

U.S. PATENT DOCUMENTS

| 3,307,045 | 2/1967 | Paivinen | 307/282 |
| 3,819,953 | 6/1974 | Puckette et al. | 307/221 D |
| 3,867,645 | 2/1975 | Weimer | 307/221 D |

FOREIGN PATENT DOCUMENTS 381,161  5/1973  U.S.S.R. ........................... 307/235 E

Primary Examiner—John S. Heyman
Attorney, Agent, or Firm—Richard S. Sciascia; Ervin F. Johnston; John Stan

[57] ABSTRACT

An inductively coupled current apparatus for differential tap currents used in conjunction with charge coupled devices (CCDs) permits the current differences flowing in tapped clock lines of charge coupled devices to be conveniently measured.

3 Claims, 1 Drawing Figure

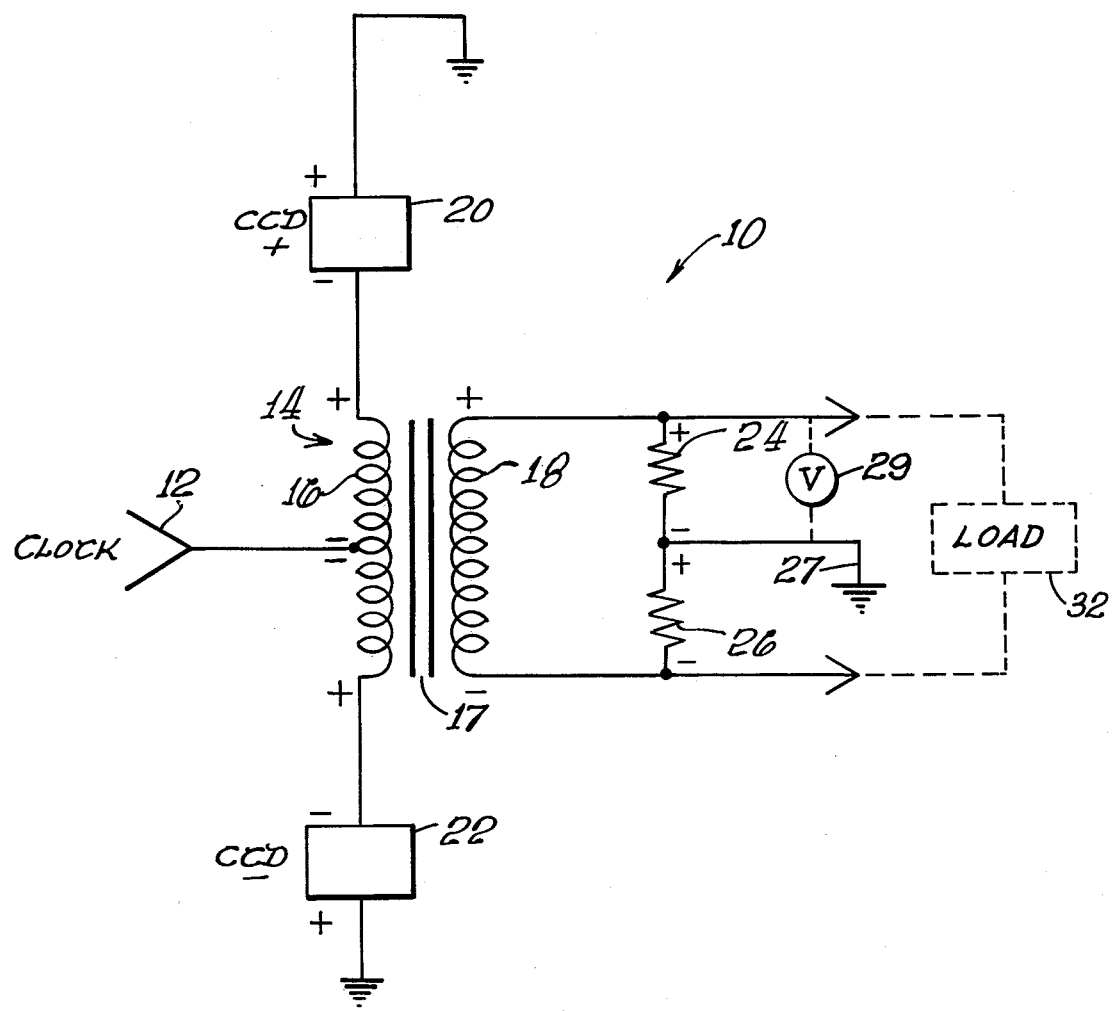

CCD DIFFERENTIAL CURRENT APPARATUS

STATEMENT OF GOVERNMENT INTEREST

The invention described herein may be manufactured and used by or for the Government of the United States of America for governmental purposes without the payment of any royalties thereon or therefor.

FIELD OF THE INVENTION

This invention pertains to the field of solid state physics. In greater particularity, this invention pertains to solid state electronic circuits. By way of further characterization, this invention pertains to the field of charge coupled devices. In still greater particularity, this invention pertains to an arrangement to measure differential currents flowing in tapped clock lines of charge coupled devices.

DESCRIPTION OF THE PRIOR ART

Prior art methods of measurement of differential current pulses flowing in the clock lines of charge coupled devices employed capacity coupled drivers which cooperated with pull-down transistors, integrating capacitors, and sample and hold circuitry. Although initially satisfactory, as the state-of-the-art of charge coupled device circuitry advanced, the prior art arrangements began limiting the dynamic range and useful linearity attainable with charge coupled devices. These limitations were especially apparent at higher frequencies.

SUMMARY OF THE INVENTION

This invention provides an improved arrangement for measuring differential currents flowing in the clock and driver lines of charge coupled devices by employing an inductance circuit which is responsive only to the differential currents flowing in the clock driver lines. It thereby develops a current which is transformer-coupled to a non-inductive resistance load, which may be utilized by conventional voltage amplifying and integrating circuitry.

STATEMENT OF THE OBJECTS OF INVENTION

It is accordingly an object of this invention to provide an improved electronic circuit.

A further object of this invention is to provide a differential current tap for charge coupled devices.

Yet another object of this invention is to provide an inductively coupled differential current tap for charge coupled circuitry.

These and other objects of the invention will become more readily apparent from the ensuing specification when taken together with the drawings.

BRIEF DESCRIPTION OF THE DRAWING

The FIGURE illustrates a schematic representation of the circuitry of the invention.

DESCRIPTION OF THE PREFERRED EMBODIMENT

The circuit of the invention is illustrated generally at 10, for connection to a source of clock signal 12. Of course, the source of clock signals 12 may be any conventional state-of-the-art clocking circuit used in modern electronic systems.

A center-tapped primary inducing 16 forms the primary winding of the transformer 14. Each end of center-tapped primary inductor 16 is connected to the clock input lines of suitable charge coupled devices to be clocked by source of clock signals 12. The charge coupled device clock lines employing positive tap weights are shown as a lumped lead 20 and, similarly, all of the negative tap weights are shown as the lumped lead 22. Currents flowing in the clocked lines due to the difference of conducting states of leads 20 and 22 will be seen to be flowing in opposite directions within center-tapped primary inductor 16, as may be seen from the ± polarity signs in the FIGURE, and, therefore, only the differential current is inductively coupled to a secondary winding 18. The ends of secondary winding 18 may be, in turn, connected to a non-inductive resistance load, shown by resistors 24 and 26.

As illustrated, the non-inductive resistive load is conveniently comprised of resistors 24 and 26 which are connected to either end of secondary inductor 18 and thence to a ground connection 27. Thus, it may be seen that resistors 24 and 26 provide a convenient load by which the differential currents flowing in the clock lines may be conveniently measured, for example, by voltmeter 29. Such resistances may have their IR voltages conveniently coupled, as indicated by arrows to state-of-the-art amplifying and integrating devices 31 for effective utilization thereby.

Transformer 14 may be of any convenient design using good pulse transformer design techniques. Thus, transformer 14 may be a toroid or other conventional transformer configuration and the placement of center tapped primary conductor 16 and secondary conductor 18 to provide optimum inductive coupling may similarly be governed by conventional pulse transformer techniques. In the example shown, a magnetic core 17 provides the necessary inductive coupling. Similarly, by employing conventional design techniques, the number of turns and size of the primary and secondary inductors may be controlled for the specific application and circuitry involved.

The foregoing description taken together with the appended claims constitute a disclosure such as to enable a person skilled in the solid state physics and electronic arts and having the benefit of the teachings contained therein to make and use the invention. Further, the structure herein described meets the objets of invention and generally constitute a meritorious advance in the art unobvious to such a person not having the benefit of these teachings.

Obviously, many modifications and variations of the present invention are possible in the light of the above teachings, and, it is therefore understood that within the scope of the disclosed inventive concept, the invention may be practiced otherwise than as specifically described.

What is claimed is:

1. A differential current apparatus for use with a source of clock signals, comprising:
   at least a pair of differentially coupled plural charge coupled solid state devices;
   a center-tapped primary inductor, connected at one end to one of the said pair of charge coupled devices and connected at the other end to the other of said pair of devices, the center tap of said primary inductor connectable to said source of clock signals; and
   a secondary inductor inductively coupled to said center-tapped primary inductor for signal transfer therebetween;

whereby when a clocking pulse is applied to the center tap of the primary of the inductor, comprising a differential current is caused by the coupled clock pulses flowing in said center-tapped primary.

2. A differential current apparatus according to claim 1 further comprising:

said source of clock signals connected to said center tap of said primary inductor.

3. A differential current apparatus according to claim 1 wherein said center-tapped primary inductor is inductively coupled to the secondary inductor by means of a core of magnetic material.

* * * * *